US010820447B1

(12) United States Patent
Miyamura et al.

(10) Patent No.: US 10,820,447 B1
(45) Date of Patent: Oct. 27, 2020

(54) IMMERSION COOLING SYSTEM WITH TOP MOUNTED BUS BAR

(71) Applicant: Baidu USA LLC, Sunnyvale, CA (US)

(72) Inventors: Harold Miyamura, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/587,719

(22) Filed: Sep. 30, 2019

(51) Int. Cl.
*H01B 7/20* (2006.01)
*H05K 7/20* (2006.01)
*H02G 5/10* (2006.01)
*G06F 1/20* (2006.01)

(52) U.S. Cl.
CPC ........... *H05K 7/20236* (2013.01); *G06F 1/20* (2013.01); *H02G 5/10* (2013.01)

(58) Field of Classification Search
CPC ......... H05K 7/20236; H02G 5/10; G06F 1/20
USPC ....................................................... 174/68.2
See application file for complete search history.

(56) References Cited

U.S. PATENT DOCUMENTS

| | | | | |
|---|---|---|---|---|
| 3,816,171 A * | 6/1974 | Toth | ...................... | H01B 7/2825 427/125 |
| 4,302,793 A * | 11/1981 | Rohner | .............. | H05K 7/20272 174/15.1 |
| 10,028,409 B1 * | 7/2018 | Metzler | .................. | H05K 7/203 |
| 10,070,558 B2 * | 9/2018 | Campbell | ................ | H05K 5/06 |
| 2014/0218859 A1 * | 8/2014 | Shelnutt | .................... | G06F 1/20 361/679.46 |
| 2014/0218861 A1 * | 8/2014 | Shelnutt | ............. | H05K 7/20809 361/679.53 |
| 2015/0109735 A1 * | 4/2015 | Campbell | .......... | H05K 7/20318 361/700 |
| 2016/0329266 A1 * | 11/2016 | Riou | ....................... | H01L 23/06 |
| 2019/0383559 A1 * | 12/2019 | Aoki | ..................... | F28D 1/0213 |

* cited by examiner

*Primary Examiner* — Sherman Ng
(74) *Attorney, Agent, or Firm* — Womble Bond Dickinson (US) LLP

(57) ABSTRACT

A liquid immersion cooling system can include a tank having an upward facing opening at a top portion of the tank. A mounting mechanism fixes one or more electronic components to an interior of the tank. A bus bar assembly is located at the top portion of the tank, the bus bar assembly having a shield that covers one or more bus bars of the bus bar assembly from above. Power terminals of each of the one or more electronic components engage with the one or more bus bars of the bus bar assembly from below.

20 Claims, 8 Drawing Sheets

SIDE VIEW

SIDE VIEW
FIG. 1A

IMMERSION COOLING SYSTEM WITH TOP MOUNTED BUS BAR

TECHNICAL FIELD

Embodiments of the present disclosure relate generally to a data center cooling management. More particularly, embodiments of the disclosure relate to electrical power distribution in an immersion cooling system.

BACKGROUND

Data centers having a plurality of networked computing devices (e.g., servers) can require thermal management to cool the computing devices. High power servers (for example, servers that perform artificial intelligence applications) that might generate large amounts of thermal energy can be cooled using liquid immersion systems. In such systems, the servers are immersed in a liquid that absorbs and transfers thermal energy from the server (or other electronic equipment) to the liquid.

In an immersion cooling system, computer electronics can be immersed in, and in direct contact with, a non-electrically conductive liquid. The liquid absorbs thermal energy from the computer electronics. The temperature of the liquid can be controlled within a defined 'safe range' by known techniques (for example, with a heat exchanger and pump), thereby cooling the servers and other support equipment (e.g., back-up battery systems).

Liquid immersion cooling systems can have a higher heat transfer capability than traditional air and liquid (e.g. direct to chip, with heat sinks and cold plates) cooling systems, while also greatly reducing the physical footprint of servers because the electronics can be packaged much closer together, e.g., in a field replaceable unit (FRU), due to the high heat transfer capability of immersion cooling.

FRUs may need servicing from time to time, for example, inspection, replacement, or troubleshooting. In the case of a vertical immersion tank (having an upward facing opening), there is a risk that objects can accidentally fall into the tank. Dropped objects such as screws, washers, tools, etc., can inadvertently short power distribution hardware that delivers power to the FRUs in the tank.

Further, to access power distribution hardware (e.g., bus bars) for servicing, the immersion fluid may have to drained from the tank, which can result in downtime to the FRUs. Immersion fluid is also expensive. Further, access to bus bars may be limited if located deep within the immersion tank. Safety can become an issue if a technician is precariously positioned while servicing the bus bars, especially if they are energized.

Accordingly, servicing in an immersion cooling system environment can be time-consuming and create safety risks due to inadvertent contact with bus bars and also risks associated with damage to equipment caused by dropped items. The issues identified are addressed with features described in the present disclosure.

BRIEF DESCRIPTION OF THE DRAWINGS

Embodiments of the invention are illustrated by way of example and are not limited by the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment", "an embodiment", "one aspect", or "an aspect" means that a particular feature, structure, or characteristic described in conjunction with the embodiment can be included in at least one embodiment or aspect of the invention. The appearances of the phrase "in one embodiment" or "in one aspect" in various places in the specification do not necessarily all refer to the same embodiment or aspect.

Aspects of the present disclosure allow accessibility and servicing for data center equipment in the local immersion cooling enclosure/tank service area. An immersion cooling tank, an emerging data center cooling technology, can be designed to provide a non-intrusive solution to a potential failure mode. Current solutions for immersion cooling that locate bus bars at a bottom of an immersion enclosure are deficient, there is not an easy process or a work around solution to fix problems with the bus bar (drain the coolant, shut down the rack, and remove all of the equipment), and then service the issue (very disruptive and has really high amount of risk).

Power distribution hardware can include one or more bus bars connected to a power supply, such as a voltage source. Typically, a first bus bar is connected to a positive terminal of a voltage source, and a second bus bar is connected to a negative and/or return terminal of the voltage source. If a conductive object inadvertently comes into contact with two of the bus bars, this can cause a short circuit resulting in extremely high current through the bus bars and the conductive object, which can result in damage to the immersion tank, the bus bars, and/or the electronic equipment housed in the tank. Some bus bar protection solutions, where the bus bars are exposed to dropped objects and contact, implement one or more short circuit protection techniques including a). smaller bus bar segments, which requires additional safety protection for each segment, to detect the current or voltage change due to a short, and then shut off the individual circuit; b) redundant (more than one) bus bars to prevent total power failure in the case of a short; and c) diverting current to the other bus bars from a damaged one, assuming multiple bus bar configuration.

Aspects of the present disclosure relate to vertical immersion tanks. Bus bars can be located at a bottom of the immersion tank. In such a case, electronic components will have power terminals that face downward to mate with the bus bars. These bus bars are at risk of shorting caused by falling objects. Objects can fall to the bottom of a tank and roll about. As more and more objects fall to the bottom over time, the risk increases. Liquid coolant used for immersion tanks can be costly, thus draining the tank to remove fallen objects is cost prohibitive. In addition, such a procedure can cause downtime of the electronic components in the tank, which can be unacceptable in the case where the electronic components are servers.

Servicing the bus bars also becomes inefficient, cumbersome, and prone to error when bus bars are located at a bottom of the tank. Where bus bars are located at the bottom of the tank, servicing them will likely require complete a complete system replacement—all fluid will be drained, requiring fluid storage and dispensing. Further, the electronic components may need to be removed to service the bus bars. As mentioned, the downtime, cost of immersion fluid, safety risk, and labor cost can be prohibitive.

Further, the depth of the tank (often exceeding 30") will make on-site servicing difficult, basic hand tools would not be suitable. Bus bar connections with FRUs are typically blind mate, meaning that they mate without being visible. Conductive items can be overlooked and possibly pinched between bus bars during the chassis insertion. Identification of any dropped items in close proximity to the bus bar is unreliable without a direct line of sight to dropped items at the bottom of the tank. Identification of loose metal items can be especially challenging where the immersion tank fabricated from metal due to lack of color contrast between the loose items and the tank. Low levels of light at the bottom of the immersion tank further decrease visibility.

Figure 1A:
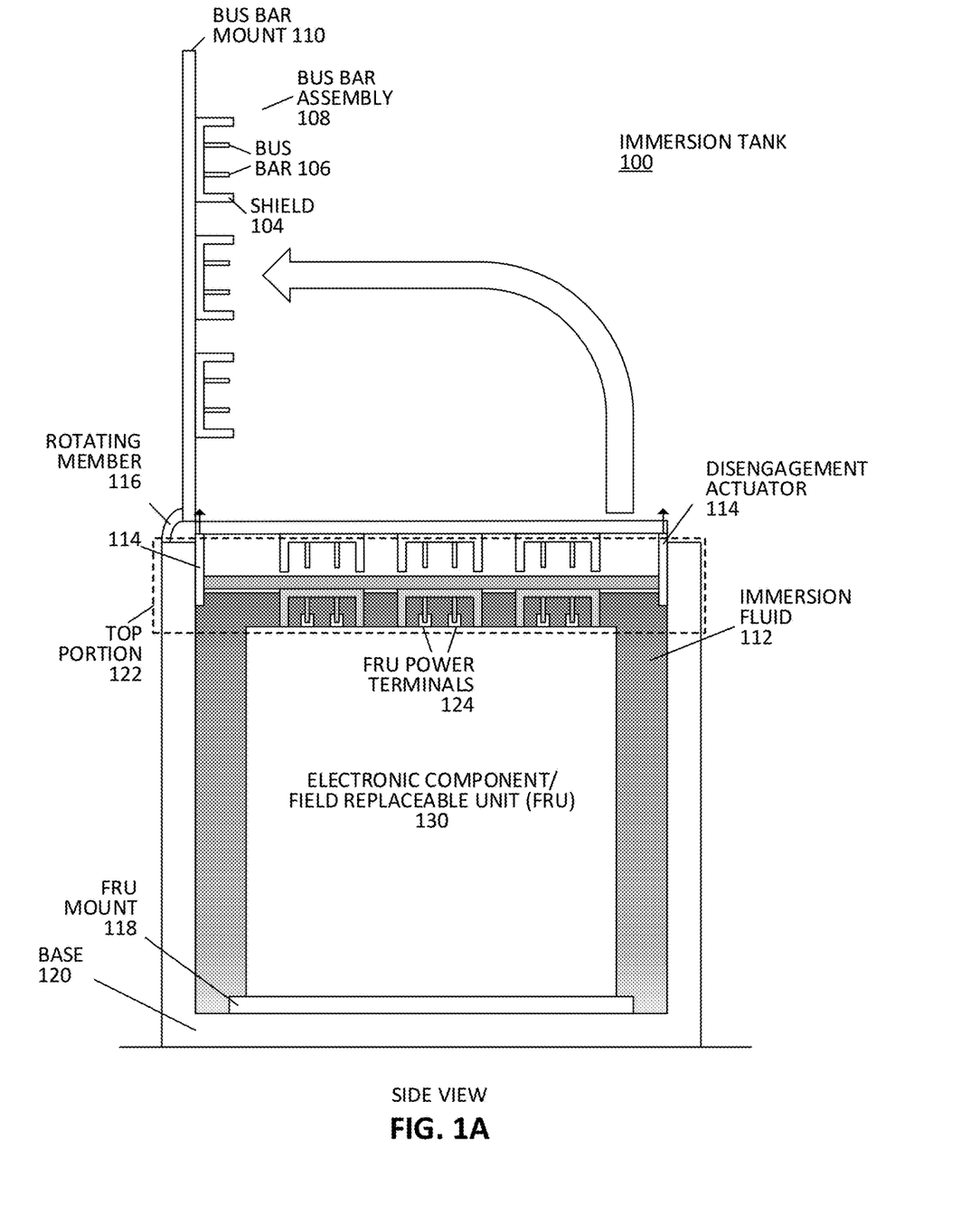
FIGS. 1A and 1B show aspects of a liquid immersion cooling system and bus bar assembly.
Figure 1B:
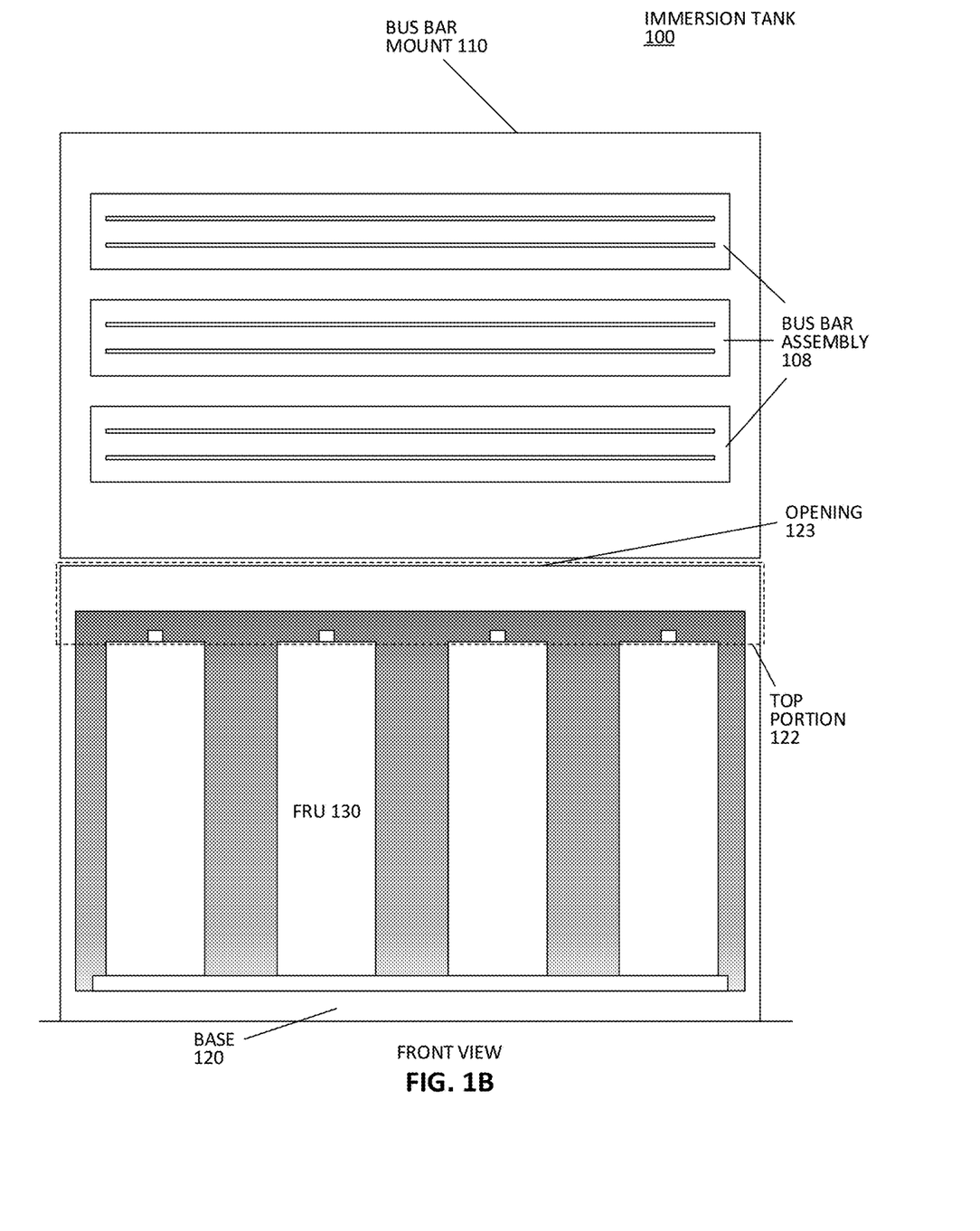

An immersion tank according to one aspect of the present disclosure is shown in FIG. 1A (side view) and FIG. 1B (front view). An immersion tank 100 can have an upward facing opening 123 at a top portion 122 of the tank. The tank is capable of carrying immersion cooling fluid 112. Fluids suitable for immersion cooling have very low conductivity to ensure that they can safely come into contact with energized electronic components without shorting them.

The immersion tank can have a mount or mounting mechanism 118 for mechanically fixing/securing one or more electronic components 130 to the interior of the tank. The mount, although shown at a base of the immersion tank, can additionally or alternatively be located at a side of the tank. The mount can be formed from any combination of hardware such as, but not limited to, mounting plates, brackets, rails, and fastening hardware.

In one aspect, the mount 118 is mechanically keyed to fix the one or more electronic components to the tank with the power terminals of each of the one or more electronic components facing upwards or toward the opening of the tank. In this position, the power terminals can engage with the one or more bus bars from below. Further the mounts and bus bar assembly 108 can be fixed to the immersion tank with one or more reference dimensions that maintain a tolerance between the bus bars and the terminals of the FRUs to ensure proper alignment and mating. The mounts can attach and fix to chassis of each FRU. The mount can attach to the tank with known fastening hardware.

A bus bar assembly 108 has a shield 104 and one or more bus bars 106. The one or more bus bars engage and mate with power terminals 124 of each of the one or more electronic components. The one or more bus bars can be formed from flat elongated strips of a conductive metal. The one or more electronic components can have terminals that engage with each bus bar through fingers that pinch the bus bars when lowered onto the terminals. Other known connection mechanisms can be used to connect the bus bars to the terminals.

When engaged with the power terminals of the electronic components, the bus bar assembly is located at the top portion 122 of the tank, the top portion being an area of the tank above the mounted electronic components. The shield 104 covers one or more bus bars of the bus bar assembly from above. The bus bar assembly is open from below (facing downward). The power terminals of each of the one or more electronic components engage with the bus bars of the bus bar assembly through the downward facing opening below the bus bars.

The power distribution hardware (e.g., the bus bars) of the immersion tank is resistant to shorting risks caused by dropped objects. The shield can deflect items that inadvertently drop into the tank, and protect service personnel from accidental contact with the bus bars, which can result in harm. Further, objects that fall into the tank and become lost at the bottom of the tank will not be a shorting risk to the bus bars due to their location at the top portion of the tank rather than at the bottom. The bus bars can be accessed and serviced without removing fluid or FRUs from the tank.

In one aspect, the immersion tank includes a disengagement actuator 114 that generates a linear force upon the one or more bus bars in an upward direction to lift and disengage the one or more bus bars from the power terminals 124 of the one or more electronic components 130. The disengagement actuator can be formed from an arrangement of hardware and known actuating components, such as but not limited to: hinges, rails, solenoids, hydraulic actuators, pulleys, and/or a user-actuated levers. The disengagement actuator can be fixed to the tank at one or more side walls of the tank, as shown in FIG. 1A. The disengagement actuator can, in other embodiments, be attached to the base 120. Other arrangements can be determined based on application and routine experimentation. The upward linear force can disengage the bus bars from the terminals in a manner that prevents or reduces lateral movement of the bus bar assembly during the disengagement, thereby reducing or preventing warping and possible damage to the power terminals and bus bars.

The immersion tank can also include one or more rotating members 116 that rotates the bus bar assembly away from the one or more electronic components when disengaged from the one or more electronic components. The rotating members can be formed from an arrangement of hardware and known actuating components, such as but not limited to: hinges, flexing members, cables, motors, pulleys, gears, and/or user-actuated handles/levers. In one aspect, the immersion tank includes a linear solenoid to disengage the bus bar and a handle that allows rotation of the bus bar when disengaged. The rotational action of the bus bar mount will cause any conductive objects (for example, screws and washers) to drop in the tank, or fall outside of the immersion enclosure, without bus bar contact.

In one aspect, the bus bar assembly includes a mount 110 that also acts as a door that rotates through the rotating member 116. The shield 104 and the one or more bus bars 106 can be attached to the mount/door. As discussed in other sections, the mount and the shield can be integrated such that the mount serves as the shield and the shield serves as the mount.

It should be understood that the bus bar assembly shown in FIG. 1A and FIG. 1B has three sets of bus bars for shared among each FRU, but the bus bar assembly can have any number of bus bars on it. For example, some FRUs require bus bars of different voltages such as but not limited to 12 Vdc, 5 Vdc, and 3.3 Vdc. In such a case, a pair of bus bars can be appropriate for each voltage. Further, some FRUs may require multiple bus bars of the same voltage from the same voltage source, to share current such that hardware (e.g., wires and circuit traces) can be reduced in size. In some embodiments, each FRU can share one to three sets of bus bars. The number and arrangement of bus bars can vary based on application and FRU requirements.

Figure 2:
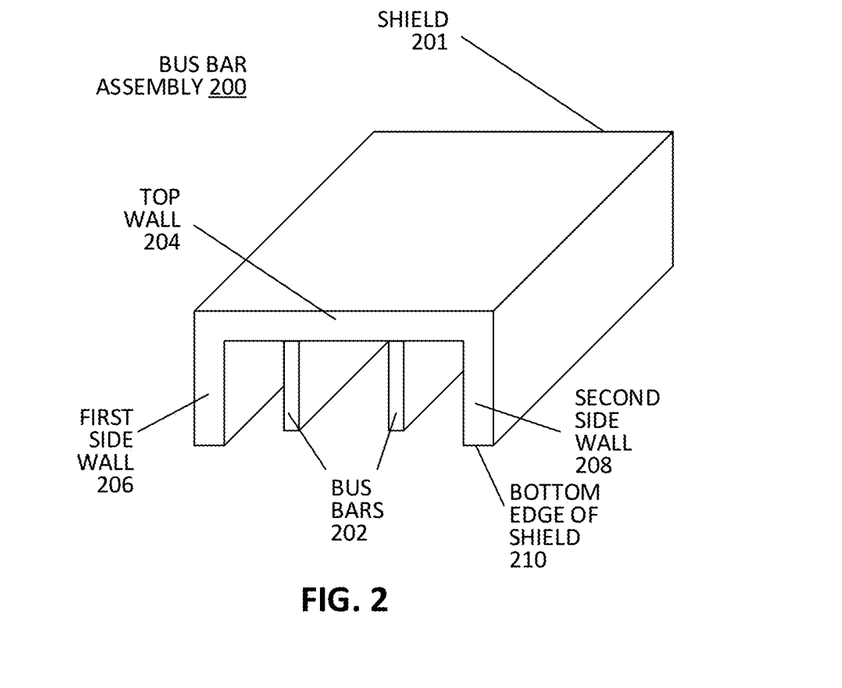
FIGS. 2 and 3 show aspects of a bus bar assembly for a liquid immersion cooling system.
Figure 5:
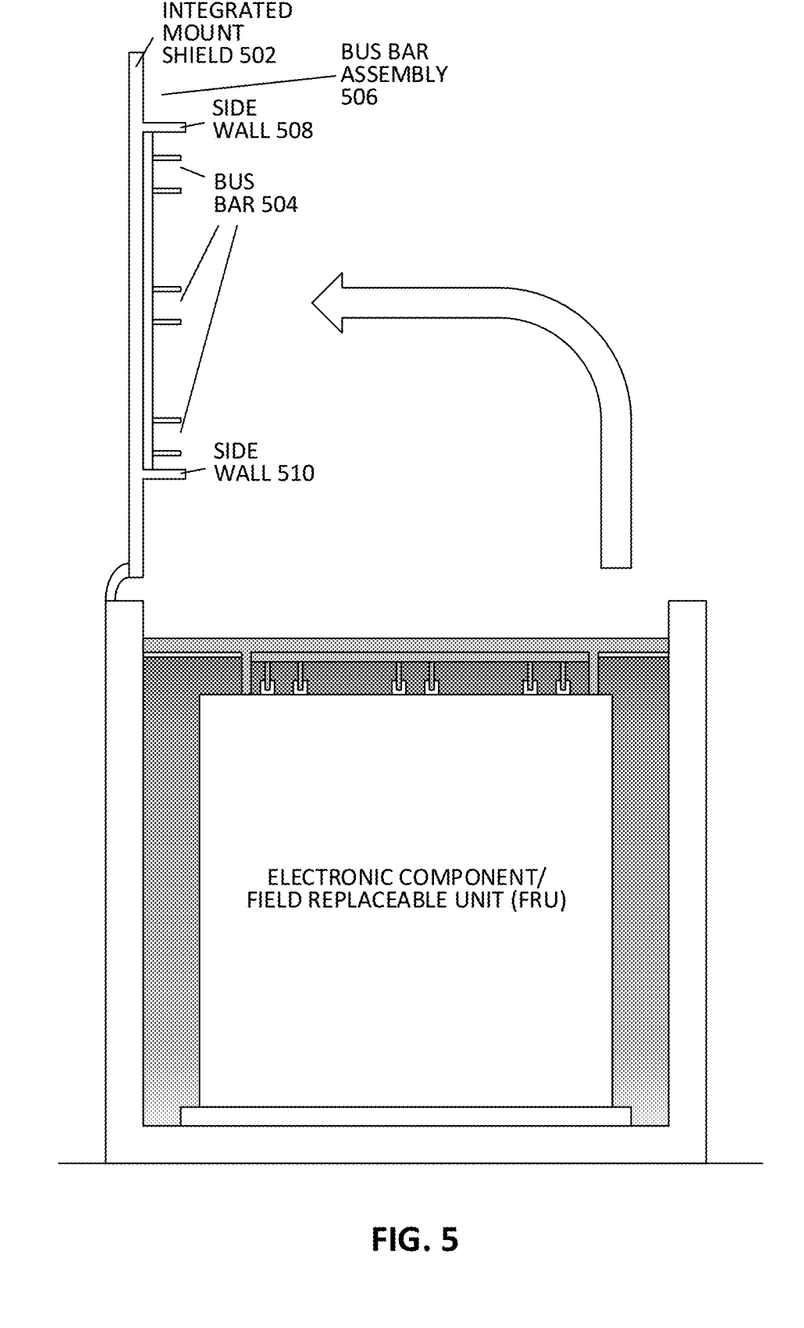
FIG. 5 shows aspects of a liquid immersion cooling system with an integrated mount shield.

Referring to FIG. 2, a bus bar assembly 200 is shown. A shield 201 of bus bars 202, which can also act as a mount and door, is formed from a top wall 204 that has at least a section that resides between a first side wall 206 and a second side wall 208. When the bus bars are engaged to the power terminals of an FRU in the immersion tank, the top wall is arranged horizontally and covers the one or more bus bars to prevent contact from above. Similarly, each of the side walls are arranged vertically (when the bus bars are engaged) to guard the one or more bus bars from lateral contact. It should be understood that the mount and shield can be integrated. For example, referring briefly to FIG. 5, the mount 502 can have a first side wall 508 and a second side wall 510 where the mount serves as a top portion of the shield. Referring back to FIG. 2, the bus bars can be recessed from a bottom edge 210 of the shield located at the bottom edges of the side walls. The recess further prevents lateral contact where the side walls act as a stop to prevent contact between the bus bars and the chassis of the FRUs, for example, during engagement. Such contact can otherwise result in a short circuit between the bus bars, equipment damage, and/or harm. In one aspect, the bus bar assembly does not have sidewalls, only a top wall. This can still shield the bus bars from contact from above. Lateral contact can still be limited due interference provided by side walls of the tank.

Figure 3:
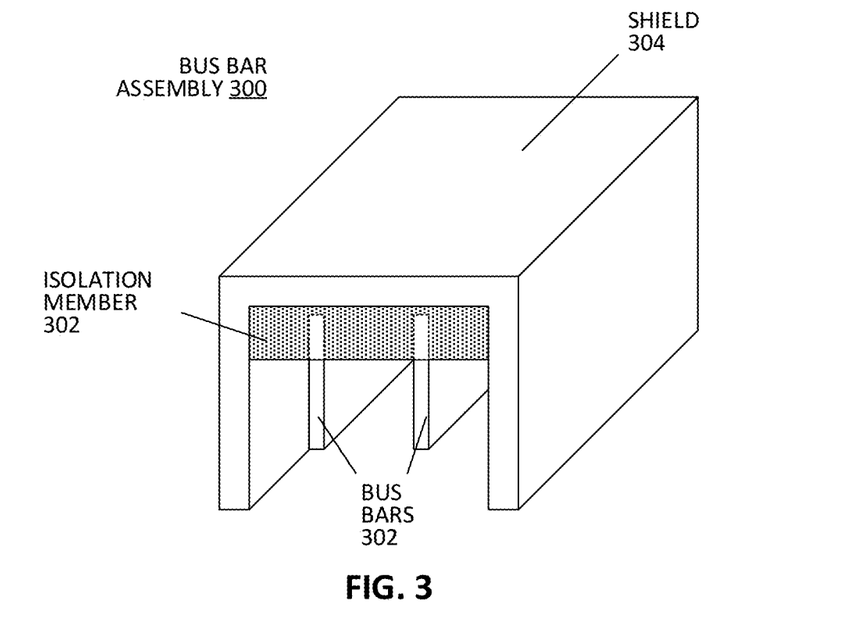

Additionally, the bus bar can include one or more isolating members to prevent contact between the bus bars and/or contact between the bus bars and the shield. For example, referring to FIG. 3, a bus bar assembly 300 includes a non-conductive isolation member 302 that blocks contact between the one or more bus bars 302 and the shield 304. The isolation member can be formed from a non-conductive suitably durable material such as, but not limited to polycarbonate. Each of the bus bars can be coupled to standoffs that are housed in the isolating member. Power cables can attach to each of the bus bars (e.g., through the standoffs) to energize them.

Figure 4:
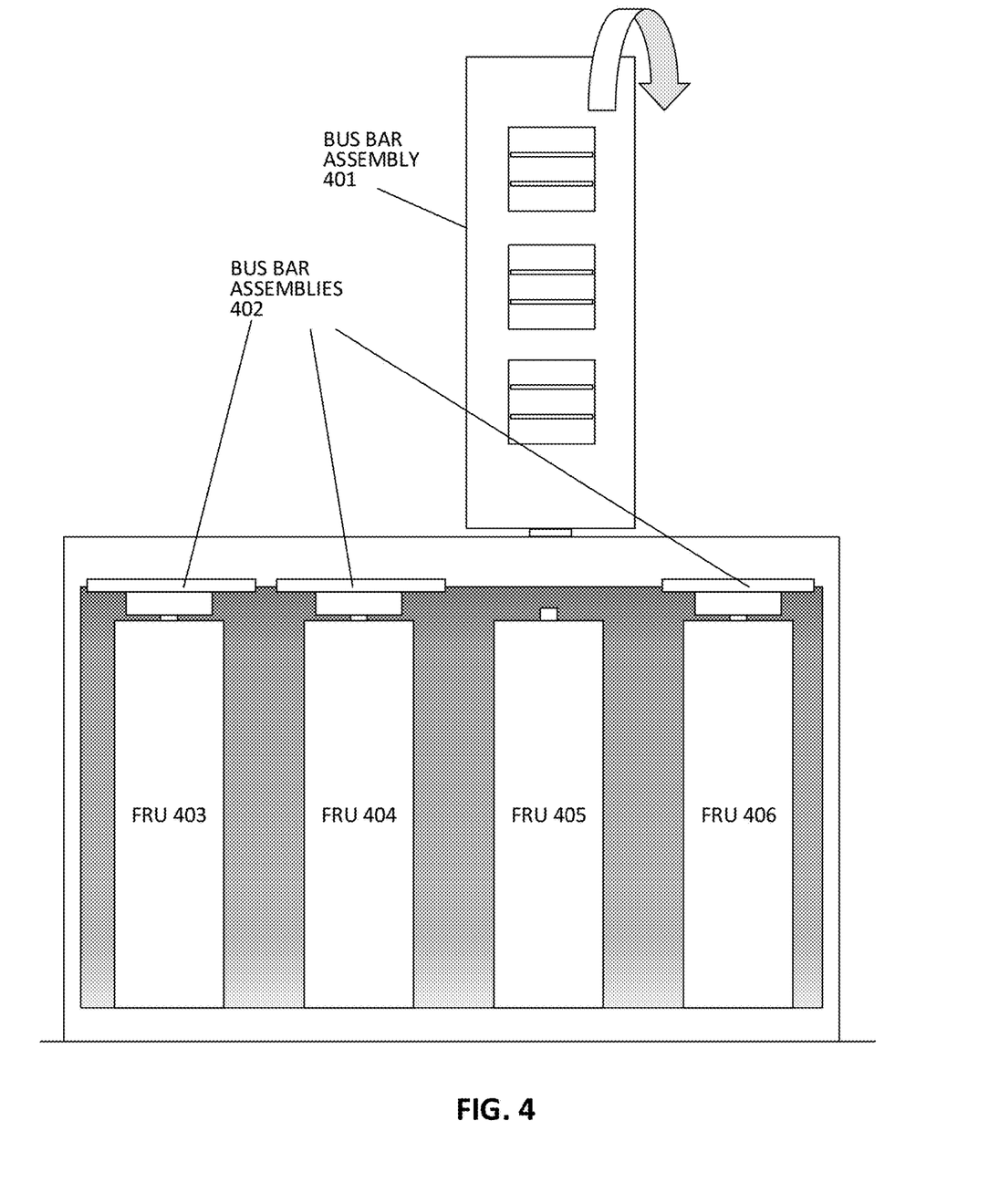
FIG. 4 shows aspects of a plurality of bus bar assemblies of a liquid immersion cooling system.

In one aspect, the tank includes a plurality of bus bar assemblies that are each a) individually capable of engagement and disengagement from at least one of the one or more electronic components and/or b) individually capable of coupling and decoupling from an electrical power source. For example, FIG. 4 shows a plurality of bus bar assemblies 401 and 402 each having a one or more bus bars fixed to a shielding mount with side walls. Each bus bar assembly can individually engage and disengage with a respective FRU. For example, bus bar assembly 401 might require servicing. The bus bar assembly 401 can be individually de-energized (disconnected from a power source) and individually disengaged from FRU 405. Bus bar assemblies 402 can remain engaged and energized so that FRUs 403, 404, and 406 do not experience down time.

Figure 6:
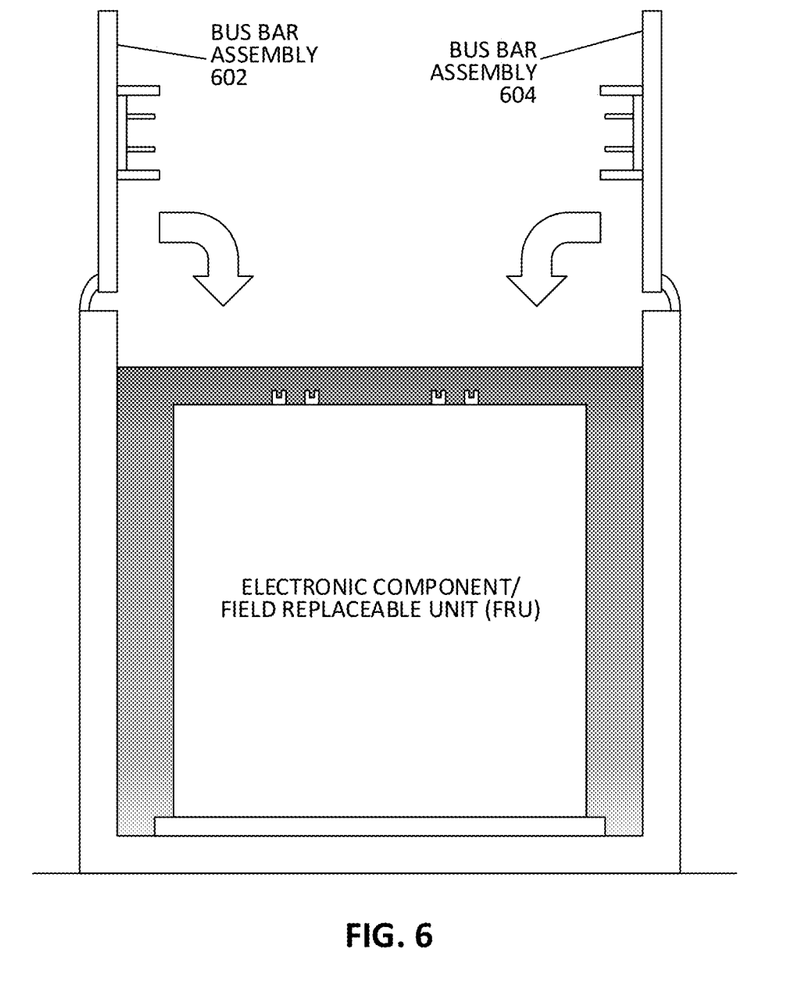
FIG. 6 shows aspects of a liquid immersion cooling system with split doors.

FIG. 6 shows an immersion tank having bus bar assemblies 602 and 604 mounted on opposite split doors. Rather than having the bus bar assemblies mount as a single door (e.g., as shown in other figures), the mounds/shields of the respective assemblies can each hinge on opposing side walls of the tank. This can reduce the overall weight of a single large door and reduce mechanical force required to open and service the doors.

Figure 7:
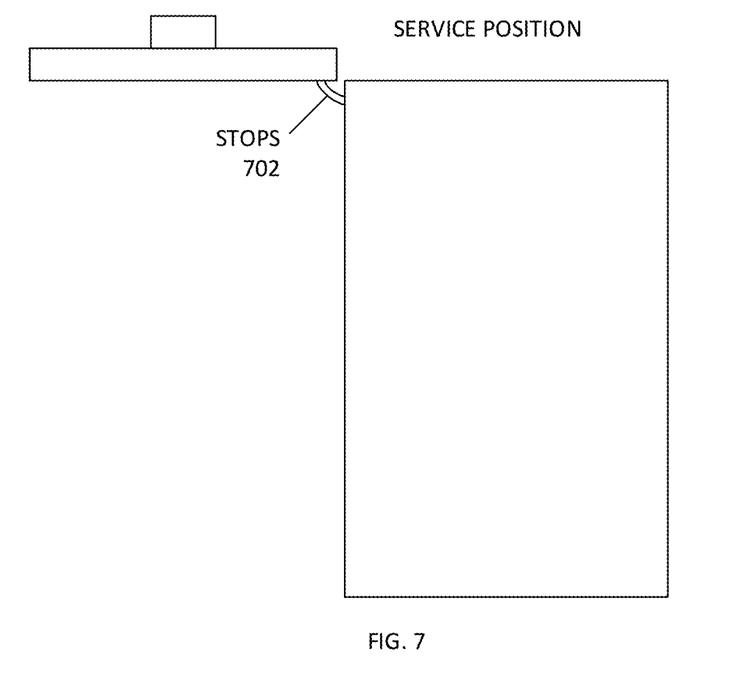
FIGS. 7 and 8 show aspects of a liquid immersion cooling system with bus bar assemblies in service position.
Figure 8:
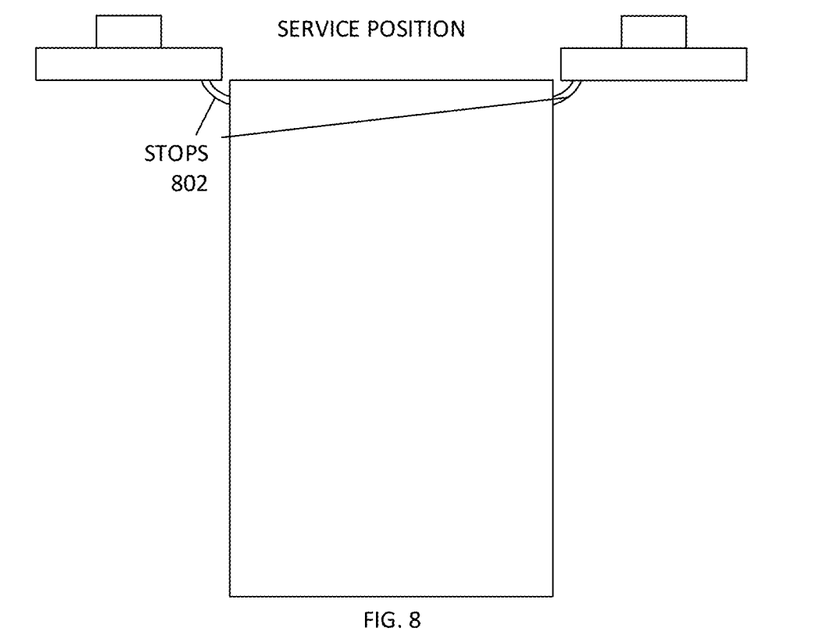

FIG. 7 and FIG. 8 show bus bar assemblies that have shields/mounts that open as doors into a service position. Stops 702 and 802 can respectively hold each bus bar assembly horizontally in place such that the bus bars face upwards during servicing. This presents a serviceable position to a technician by providing visibility and reachability to the bus bars. This position also moves the bus bars away from the tank opening, which further reduces the risk of dropping objects such as fastening hardware and tools into the tank. The stops can be integrated into the rotating member described in relation to FIGS. 1A and 1B. Stops can use a combination of hardware such as but not limited to a latch, a rod, or a bumper.

Figure 9:
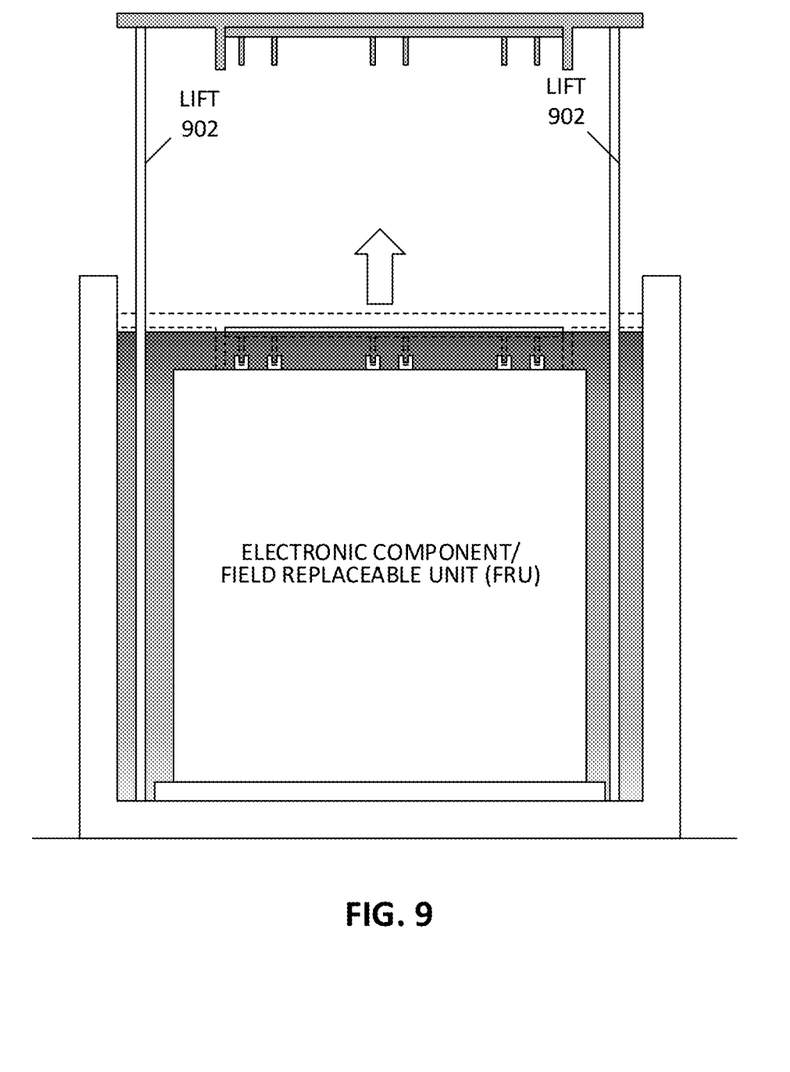
FIG. 9 shows aspects of a liquid immersion cooling system with a vertical lift system.

According to some aspects, an immersion tank is shown in FIG. 9 that includes a lift mechanism 902 that lifts the bus bar assembly vertically (e.g., without rotation). The lift can provide ample clearance between the bus bar assembly and the tank to allow servicing of the bus bars. In one aspect, the lift can include a telescoping slide rail. Hydraulics, cranks, motors, pulleys, or other known actuating mechanisms can be implemented to generate the vertical force.

It should be understood that the various features shown with respect to one figure can also be present in other embodiments of different feature.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion tank for providing immersion cooling for electronic devices, the immersion tank comprising:
   a tank having an upward facing opening at a top portion of the tank;
   a mounting mechanism for fixing one or more electronic components to an interior of the tank; and
   a bus bar assembly located at the top portion of the tank, the bus bar assembly having a shield that covers one or more bus bars of the bus bar assembly from above, wherein power terminals of each of the one or more electronic components engage with the one or more bus bars from below when the electronic components are deposited into the interior of the tank.

2. The immersion tank according to claim 1, wherein the shield includes a top wall having at least a section that resides between a first side wall and a second side wall, the top wall being arranged horizontally when the one or more bus bars are engaged with the power terminals, and each of the first and second side walls being arranged vertically.

3. The immersion tank according to claim 1, wherein the one or more bus bars is recessed from a bottom edge of the shield.

4. The immersion tank according to claim 1, wherein the mounting mechanism is mechanically keyed to fix the one or more electronic components to the tank with the power terminals of each of the one or more electronic components facing the opening of the tank, to engage with the one or more bus bars.

5. The immersion tank according to claim 1, wherein the bus bar assembly includes a disengagement actuator that generates a linear force upon the one or more bus bars in an upward direction to lift and disengage the one or more bus bars from the power terminals of the one or more electronic components.

6. The immersion tank according to claim 5, wherein the disengagement actuator includes one or more of the following, a hinge, a solenoid, a hydraulic actuator, or a user-actuated lever.

7. The immersion tank according to claim 6, wherein the bus bar assembly includes a rotating member that rotates the bus bar assembly away from the one or more electronic components when disengaged from the one or more electronic components.

8. The immersion tank according to claim 7, wherein the bus bar assembly includes a door that rotates through the rotating member, the shield and the one or more bus bars being attached to the door.

9. The immersion tank according to claim 1, wherein the bus bar assembly includes a non-conductive isolation member that blocks contact between the one or more bus bars and the shield.

10. The immersion tank according to claim 1, wherein the tank includes a plurality of bus bar assemblies that are each a) individually capable of engagement and disengagement from at least one of the one or more electronic components and b) individually capable of coupling and decoupling from an electrical power source.

11. An immersion cooling system, comprising:
a tank, capable of carrying a cooling liquid, having an upward facing opening at a top portion of the tank;
a mounting mechanism for fixing one or more electronic components to an interior of the tank; and
a bus bar assembly located at the top portion of the tank, the bus bar assembly having a shield that covers one or more bus bars of the bus bar assembly from above, wherein power terminals of each of the one or more electronic components engage with the one or more bus bars of the bus bar assembly from below.

12. The cooling system according to claim 11, wherein the shield includes a top wall having at least a section that resides between a first side wall and a second side wall, the top wall being arranged horizontally when the one or more bus bars are engaged with the power terminals, and each of the side walls being arranged vertically.

13. The cooling system according to claim 11, wherein the one or more bus bars is recessed from a bottom edge of the shield.

14. The cooling system according to claim 11, wherein the bus bar assembly includes a disengagement actuator that generates a linear force upon the one or more bus bars in an upward direction to lift and disengage the one or more bus bars from the power terminals of the one or more electronic components.

15. The cooling system according to claim 14, wherein the disengagement actuator includes one or more of the following, a hinge, a solenoid, a hydraulic actuator, or a user-actuated lever.

16. The cooling system according to claim 15, wherein the bus bar assembly includes a rotating member that rotates the bus bar assembly away from the one or more electronic components when disengaged from the one or more electronic components.

17. An article of manufacture, comprising:
a tank, capable of carrying a cooling liquid, having an upward facing opening at a top portion of the tank;
a mounting mechanism for fixing one or more electronic components to an interior of the tank; and
a bus bar assembly located at the top portion of the tank, the bus bar assembly having a shield that covers one or more bus bars of the bus bar assembly from above, wherein power terminals of each of the one or more electronic components engage with the one or more bus bars of the bus bar assembly from below.

18. The article of manufacture according to claim 17, wherein the shield includes a top wall having at least a section that resides between a first side wall and a second side wall, the top wall being arranged horizontally when the one or more bus bars are engaged with the power terminals, and each of the side walls being arranged vertically.

19. The article of manufacture according to claim 18, wherein the one or more bus bars is recessed from a bottom edge of the shield.

20. The article of manufacture according to claim 19, wherein the bus bar assembly includes a disengagement actuator that generates a linear force upon the one or more bus bars in an upward direction to lift and disengage the one or more bus bars from the power terminals of the one or more electronic components.

* * * * *